(12) United States Patent
Kook et al.

(10) Patent No.: US 8,241,986 B2
(45) Date of Patent: Aug. 14, 2012

(54) SEMICONDUCTOR DEVICE AND PROCESS FOR REDUCING DAMAGING BREAKDOWN IN GATE DIELECTRICS

(75) Inventors: Taeho Kook, Orlando, FL (US); Tanya Nigam, Sunnyvale, CA (US); Bonnie E. Weir, Bronxville, NY (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 13/311,299

(22) Filed: Dec. 5, 2011

(65) Prior Publication Data

US 2012/0077323 A1   Mar. 29, 2012

Related U.S. Application Data

(62) Division of application No. 11/425,295, filed on Jun. 20, 2006, now Pat. No. 8,089,130.

(51) Int. Cl.
*H01L 21/28* (2006.01)
(52) U.S. Cl. ............... 438/382; 438/135; 438/171
(58) Field of Classification Search .......... 438/135, 438/171, 382; 257/E21.19
See application file for complete search history.

(56) References Cited

U.S. PATENT DOCUMENTS

| | | | |
|---|---|---|---|
| 6,600,212 B2 * | 7/2003 | Takayanagi et al. | .......... 257/369 |
| 7,176,530 B1 | 2/2007 | Bulucea et al. | |
| 2005/0133864 A1 | 6/2005 | Iwamatsu et al. | |
| 2007/0290278 A1 | 12/2007 | Kook et al. | |

OTHER PUBLICATIONS

Alam, M. et al., When it comes to scaling of gate oxides, will the technology be reliable for the next ten years or will it short circuit?, IEEE Circuits & Devices Magazine, Mar. 2002, pp. 42-48.
Weir, B.E., et al., Ultra-Thin Gate Dielectrics: They Break Down, But Do They Fall?, 1997 IEEE, IEDM 97, pp. 73-76.

* cited by examiner

*Primary Examiner* — Cuong Q Nguyen
*Assistant Examiner* — Tran Tran

(57) ABSTRACT

The present invention, in one aspect, provides an integrated circuit that comprises a first region of transistors having gate structures with a low dopant concentration, and a second region of transistors having gate structures with a dopant concentration substantially higher than the gate structures of the first region, and wherein the transistors in the first region comprise a substantial portion of the integrated circuit. The transistors may include a resistor region located between an upper portion of the gate and the gate dielectric.

8 Claims, 5 Drawing Sheets

SEMICONDUCTOR DEVICE AND PROCESS FOR REDUCING DAMAGING BREAKDOWN IN GATE DIELECTRICS

CROSS-REFERENCE TO RELATED APPLICATIONS

This Application is a Divisional of U.S. application Ser. No. 11/425,295 filed on Jun. 20, 2006 now U.S Pat. No. 8,089,130, to Taeho Kook, et al., entitled "SEMICONDUCTOR DEVICE AND PROCESS FOR REDUCING DAMAGING BREAKDOWN IN GATE DIELECTRICS ," currently allowed; commonly assigned with the present invention and incorporated herein by reference.

TECHNICAL FIELD OF THE INVENTION

The present invention is directed, in general, to an electronic device and a process for fabricating the device that includes an insulator, such as a dielectric and, more specifically, to a device which has the quality that when dielectric breakdown occurs, such breakdown results in reduced damage in dielectrics.

BACKGROUND OF THE INVENTION

Over the last 40 years, the number of transistors per unit area and the speed at which they switch have doubled every 2 years. To achieve this, the transistors have been scaled down in each successive generation. Designing small MOSEFT transistors that still turn on and off properly at high speed is difficult because the various device parameters, such as junction depth, oxide thickness, and substrate doping density, that govern the transistor operation in precise portion must also be scaled down. For example, the gate oxide thickness should decrease with each technology node to improve the on-current of a transistor, which can charge the node capacitors more easily. However, as the gate oxide gets thinner, ensuring its reliability becomes increasingly difficult.

As transistors are used over long periods of time, the stress imparted to the thin gate insulators by applied voltages increases the probability of hard breakdown. At hard breakdown, an ohmic pathway exists across the gate dielectric and transistor function can be completely destroyed. Thus, operational lifetime of the devices will continue to be a major concern.

However, as operating voltages are reduced, the amount of power required to cause ohmic or hard breakdown may not be available. When a path of defects forms across a dielectric, but power to cause melting of silicon is not available, this is called soft breakdown. The resulting leakage across the dielectric is larger than the leakage across an undamaged dielectric, but smaller than the leakage resulting from hard breakdown.

In some cases, dielectric breakdown proceeds quickly from soft to hard breakdown. In other cases, the transistor remains in the soft breakdown condition and continues to function acceptably as a transistor. The operational lifetime for a transistor can be extended if oxide breakdown is kept soft and hard breakdown does not immediately ensue.

Dielectric breakdown is a statistical process and manufacturers use statistical reliability specifications. Therefore, the overall operational lifetime of a product can be extended if the operational lifetime of a majority of the components in a product is extended.

Accordingly, what is needed in the art is an electronics device and a process for making that device that extends the operational lifetime.

SUMMARY OF THE INVENTION

To address the above-discussed deficiencies of the prior art, the invention, in one embodiment, provides an integrated circuit (IC) that comprises a first type of transistor that has a gate structure with a given dopant concentration. The first type of transistor occupies a first area of a substrate surface. Further included is a second type of transistor that has a gate structure with a dopant concentration higher than the given dopant concentration and that occupies a second area of the substrate surface that is less than the first area. The first area comprises a substantial portion of a total area occupied by the first and second areas, and the transistors in the first and second areas are configured to have a same operating voltage.

In another embodiment, the invention provides a semiconductor device that comprises a first area of transistors wherein each transistor includes a gate structure that has a gate electrode located over a semiconductor substrate, a gate dielectric layer, and a resistor region located within the gate and between the gate electrode and the gate dielectric layer, the transistors having a median time to hard breakdown. This embodiment further comprises a second area of transistors having a shorter median time to hard breakdown than the transistors in the first area. The transistors in the first area comprises a substantial portion of a total area occupied by the first and second areas, and they are configured to have a same operating voltage as the transistors in the second area.

In another embodiment, the present invention provides a method of manufacturing a semiconductor device. The method comprises forming a first area of transistors wherein each transistor includes a gate structure that includes a gate electrode located over a semiconductor substrate, a gate dielectric layer, and a resistor region located within the gate and between the gate electrode and the gate dielectric layer. The transistors in the first area have a median time to hard breakdown. The method further includes forming a second area of transistors having a shorter median time to hard breakdown than the transistors in the first area. The transistors in the first area comprise a substantial portion of the total area occupied by the first and second areas and are configured to have a same operating voltage as the transistors in the second area.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
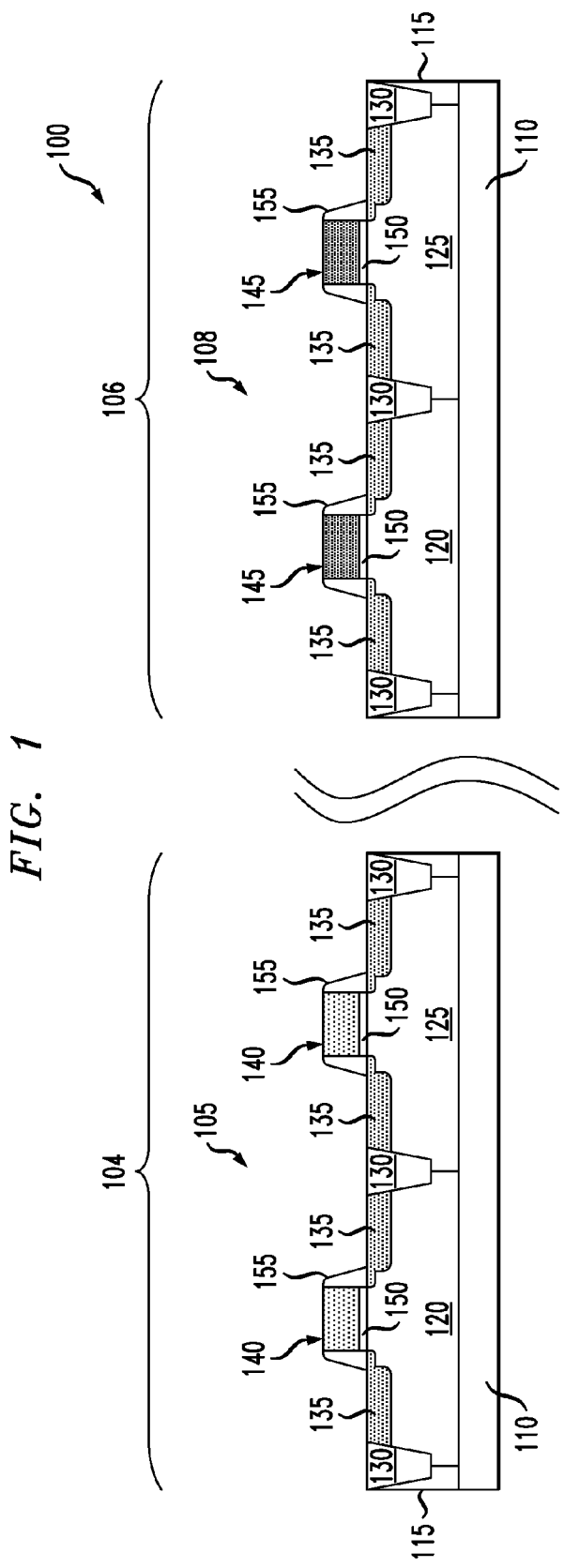
FIG. 1 illustrates a sectional view of one embodiment of a semiconductor device provided by the present invention.

It has been found that doping the gate with a dopant concentration that is lower than conventionally done, or otherwise placing a resistor region within the gate electrode has the unexpected effect of increasing the ratio of soft to hard breakdown as compared to conventionally constructed devices. FIG. 1 is a sectional view of one embodiment of an electronics device, such as a semiconductor device 100 that may be manufactured according to principles of the present invention. In one embodiment, the semiconductor device 100 may be an integrated circuit. The semiconductor device 100 includes a first area 104 that comprises a plurality of transistors 105 and a second area 106 that includes a second plurality of conventional transistors 108. As explained below, the transistors 105 are designed to significantly reduce the probability of or prevent hard breakdown after soft breakdown occurs, when compared to the conventional transistors 108 in the second area 106. This may be achieved in different ways, some examples of which are explained below.

Those skilled in the art will understand that the time to hard breakdown for a given probability depends on the gate area, the operating voltage and the operating temperature. It is understood for the purposes of this invention that whenever these two types of transistors are discussed, they will operate at the same voltage and ambient temperature.

As used herein, the gate area of a transistor is defined as the surface area of the interface between the gate dielectric and gate electrode. As used herein, the "area" of a group of transistors is the sum of the gate areas of each of the transistors which make up the group. In addition, for simplicity of language, whenever comparisons of lifetime are made, the median lifetime is used. However, in some cases it may be more appropriate to compare the time to 100 ppm failure or some other probability for two types of transistors. It should be understood that the language comparing median lifetime also covers the cases where comparisons are made at another probability level. In an advantageous embodiment, the gate areas of the two types of transistors will be optimized in order to meet the overall reliability specification of the chip.

In order to further illustrate the area optimization process, an example of one embodiment as provided by the invention will now be detailed. An integrated circuit with a total gate area of 0.01 cm$^2$ uses a 1.3 nm oxynitride as a gate dielectric and must meet a specification of less than 100 ppm failure rate at 10 years. In other words, less than 100 ppm can experience hard breakdown in 10 years. If all of the transistors are constructed without a resistor layer in the gate, the time for 100 ppm to reach hard breakdown is 1 year. Therefore, two types of transistor are included. Type 1 which does not have a resistor layer and has high performance and type 2 which has a resistor layer but has slightly lower performance. By pinpointing places in the circuit which require high performance, the gate area of type 1 transistors can be reduced to 5e-4 cm$^2$. Reducing the area increases the time to 100 ppm failure for the type 1 transistors to 18 years. Type 2 transistors which include a resistor layer have a time to 100 ppm failure for 0.01 cm$^2$ area of 12 years. Therefore, the rest of the integrated circuit would use the type 2 transistors. The gate area of the type 1 transistors is 5% of the total gate area and the gate area of the type 2 transistors is 95% of the total area. The time to 100 ppm failure for the entire integrated circuit composed of both type 1 and type 2 transistors, then, will meet the 10 year requirement.

In the embodiment illustrated in FIG. 1, the transistors 105 in the first area 104, (i.e, the sum of the total gate area occupied by the transistors 105), are constructed to have a gate electrode dopant concentration that is lower than a dopant concentration of the gate electrodes of transistors 108 in the second area 106 (i.e, the sum of the total gate area occupied by the transistors 108). The first and second areas 104 and 106 substantially constitute the total gate area occupied by the transistors 105 and 108 and are shown to be separated for ease of illustration and discussion. However, it should be understood that these areas may be integrated in, for example, a checker-board fashion or in any other configuration and may not be segregated as shown. The transistors 105 and 108 are formed over a conventional semiconductor substrate 110, which in FIG. 1 is illustrated as a semiconductor wafer. Examples of the materials that can be used to form the substrate include silicon, silicon germanium, or gallium arsenide. Other semiconductive materials known to those skilled in the art may also be used.

Located over the substrate 110 is a conventional active layer 115. The active layer 115 may be an epitaxial layer or it may be a doped region of the substrate 110. Conventionally formed wells 120 and 125 are located within the active layer 115. The wells 120 and 125 may both be appropriately doped as an NMOS or PMOS in each of the respective regions. Conventional isolation structures 130 are also included in the semiconductor device 100.

Conventional source/drains 135 are located within the wells and are doped with a dopant that is opposite to that of the wells 120 and 125. For example, in a CMOS configuration, if well 120 is doped with a p-type dopant, such as boron, then the source/drains 135 located within well 120 will be doped with an n-type of dopant, such a phosphorous, arsenic or a combination thereof to form an n-channel (NMOS) device. In contrast, if well 125 is doped with the n-type dopants mentioned above, then the source/drains 135 within well 125 will be doped with the p-type dopant to form a p-channel (PMOS) device. The source/drains 135 are illustrated and include a lightly doped drain (LDD) region. However, in other embodiments, the LDD region may not be present.

Gate structures 140 and 145 are located over the substrate 110 and the active layer 115 and are isolated from the active layer 115 by a conventional gate dielectric 150 and include conventional oxide spacers 155. While only a couple of the gate structures 140 and 145 are shown, it should be understood that the semiconductor device 100 will contain a plurality of each of these gate structures.

In accordance with the present invention, gate structures 140 will be configured to significantly reduce the probability of or prevent hard breakdown after soft breakdown occurs, and thereby, will have a substantially extended operational life or time to hard breakdown when compared to conventionally configured transistors, which in FIG. 1 are represented by gate structures 145. Gate structures 140 will be configured to either have a dopant concentration that is lower than the dopant concentration found in gate structures 145, or they will otherwise be fabricated to each have a resistor region located between an upper portion of each of the gate structures 140 and the gate dielectric 150, or they will have a graded dopant distribution. Further, the transistors 105 and 108 are configured (i.e. designed) to operate at the same operating voltage. The various configurations that can be used to achieve these different embodiments are discussed below.

The area occupied by gate structures 140 will comprise a substantial portion of the total area occupies by the gate structure 140 and 145 of the semiconductor device 100. In one aspect, the area covered by gate structures 140 in area 104 will comprise more than 50% of the area, while in another embodiment, the area covered by gate structures 140 will comprise about 80% to 99.9% of the total area.

The dopant scheme of gate structures 140 and 145 within each area may be doped with the same type of dopant scheme or be doped with a different type of dopant. For example, the gate structures 140 may be doped as an NMOS or PMOS, and the gate structures 145 may have the same or different dopant scheme.

It has been found that the lower dopant concentration in gate structures 140 extend the operation life of the transistors 105 by significantly reducing the probability of or preventing hard breakdown. It has been observed that the lower dopant concentration evidently inhibits the thermal runaway that leads to hard breakdown where total device failure occurs. Since dielectric breakdown is a statistical process, reducing the area of gate structures 145 will reduce the probability that hard breakdown will occur in that area and therefore allow a total reliability specification to be reached.

Figure 2:
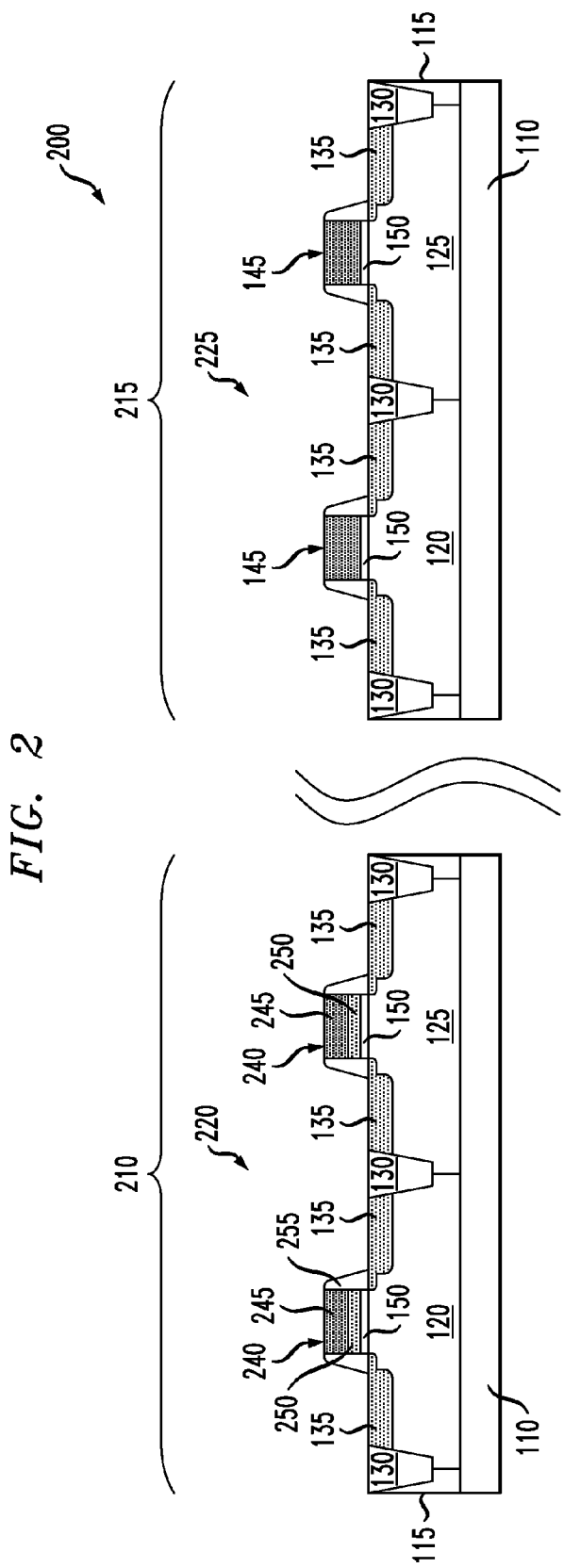
FIG. 2 illustrates a sectional view of another embodiment of a semiconductor device provided by the present invention.

FIG. 2 illustrates another embodiment of a semiconductor device 200 covered by the invention. This embodiment includes many of the conventional structures discussed above regarding FIG. 1. As such, they are numbered the same and will not be discussed further. The illustrated embodiment of the semiconductor device 200 includes two areas 210, 215 of transistors 220, 225.

Transistors 220, include gate structures 240 that have been formed in accordance with the invention to significantly reduce or prevent hard breakdown. In this particular embodiment, the gate structures 240 have been formed with a dual doping configuration resulting in the gate structures 240 having a gate electrode 245 and a resistor 250 region. The gate electrode 245 has a higher doping concentration than the resistor region 250. The resistor region 250 is preferably located between the gate electrode 245 and the gate dielectric 150. In such instances, the resistor region 250 can act as a resistor within the gate 240, since it has a higher resistance than the doped region 245. The presence of this less conductive region can have the effect of significantly reducing or preventing hard breakdown. For example, the ratio of hard to soft breakdown may change from 1/5 to 1/1000, thereby substantially extending the overall life of the device.

In one embodiment, the gate electrode and resistor regions 245, 250 may be formed by forming a single polysilicon layer and then conducting different implant or diffusion steps. In such embodiments, the resistor region 250 is formed by implanting or diffusing a dopant into the polysilicon layer, for example, at an implant concentration ranging from about 2E14 atoms/cm$^2$ to about 1E15 atoms/cm$^2$ to achieve a dopant concentration in the resistor region 250 ranging from about 1E18 atoms/cm$^3$ to about 1E20 atoms/cm$^3$.

Following the formation of the resistor region 250, the gate electrode 245 may be formed in much the same way as the region 250 except that higher dopant concentrations would be used. For example, the gate electrode 245 can be formed by implanting or diffusing a dopant into the polysilicon layer at an implant concentration ranging from about 8E14 atoms/cm$^2$ to about 5E15 atoms/cm$^2$ to achieve a dopant concentration in the gate electrode 245 ranging from about 1E19 atoms/cm$^3$ to about 1E20 atoms/cm$^3$. Those who are skilled in the art will understand how to conduct the implantation or diffusion steps. Again, it should be noted that the second area 215 will be appropriately masked to protect it from the implantation or diffusion process that forms the doped region 245.

In forming both the gate electrode and resistor region 245 and 250, those who are skilled in the art will understand that the types of dopants will vary depending on the type of device that is to be achieved. They will also understand how to appropriately mask the device in forming an NMOS or PMOS configuration. Upon the deposition and doping of both the layers, the layers are conventionally patterned and conventional oxide spacers 255 are formed adjacent each of the gate structures 240 and 145 to complete the transistors 220.

The formation of the gate structures 145 in the second area 215 may use the same type of materials used to form the gate structures 240 in the first area 210, but the dopants used may be different, depending on the whether the device is an NMOS or PMOS, but the dopant concentrations will be higher. For example, the dopant concentration of the gate structures 145 in area 215 will range from about 1E19 atoms/cm$^3$ to about 1E20 atoms/cm$^3$. At this point, conventional processes are used to complete the fabrication of the semiconductor device 200 as required by design. As with previous embodiments, the transistors in the first and second areas 210 and 215 are configured or designed to operate at the same operating voltage.

The area covered by gate structures 240 will comprise a substantial portion of the total area covered by the gate structures 240 and 145. In one aspect, the area covered by gate structures 240 in area 210 will comprise more than 50% of the total area, while in another embodiment, the area covered by gate structures 240 will comprise about 80% to 99.9% of the total area.

Figure 3:
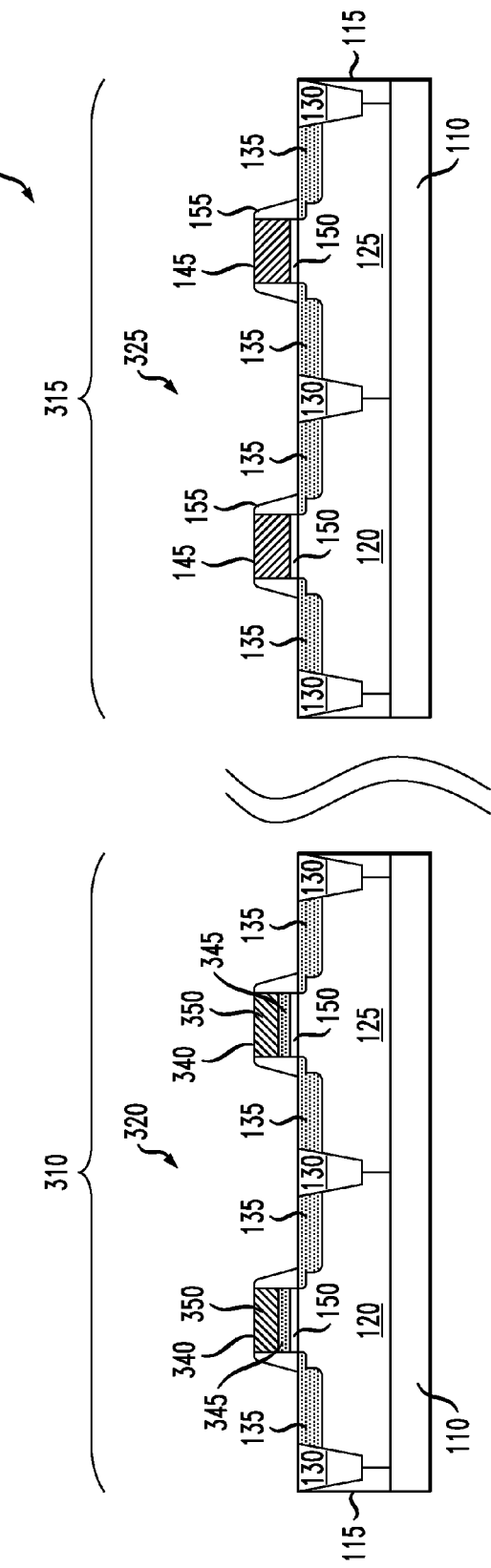
FIG. 3 illustrates a sectional view of another embodiment of a semiconductor device provided by the present invention.

FIG. 3 illustrates another embodiment of a semiconductor device 300 covered by the present invention. This embodiment includes many of the conventional structures discussed above in FIGS. 1 and 2. As such, they are numbered the same and will not be discussed further. One embodiment of the semiconductor device 300 includes two areas 310, 315 comprising transistors 320, 325.

Transistors 320, include gate structures 340 that have been formed in accordance with the invention to significantly reduce or prevent hard breakdown. In this particular embodiment, the gate structures 340 have been formed with a gate structure that includes a lower region 345 over which is located an upper region 350 comprising a metal or metal silicide. The lower region 345 may be a doped polysilicon that is located between the upper region 350 and the gate dielectric 155. The amount of dopant will vary, but conductivity between the lower and upper regions 345, 350 should be different such that the lower region 345 acts as a resistor within the gate structures 340.

In an advantageous embodiment, the lower region 345 has a dopant concentration that ranges from about 1E18 atoms/cm$^3$ to about 1E20 atoms/cm$^3$. In such an instance, the lower region 345 will act as a resistor within the gate 340, since it has a higher resistance than the upper region 350. The presence of this less conductive region within the gate 340 can have the effect of significantly reducing the probability of or preventing hard breakdown. This configuration provides the same advantages as those discussed above regarding other embodiments.

With the formation of the lower region 345 complete, the upper region 350 is formed by using conventional processes, such as physical vapor deposition, chemical vapor deposition, atomic layer deposition, etc. to deposit a metal layer over the lower region 345. Some examples of the metals that can be used to form the upper region 350 include, tungsten, nickel, cobalt, titanium, aluminum, platinum, nickel silicide, cobalt silicide, or tungsten silicide. Those who are skilled in the art will understand how to deposit such layers. The thickness of all of the layers in the various embodiments described herein will depend on design parameters. It should be noted that the second area 315 will be masked appropriately to protect that area from undesired deposition or material formation.

In an alternative embodiment, the transistors 325 in area 315 may be formed by a fully silicide (FUSI) process where nickel, cobalt, aluminum, tungsten, platinum or any alloy of those elements is deposited on polysilicon followed by a 30 second anneal at 800° C., which fully silicides the polysilicon. The transistors 320 in area 310 would be formed later and would be annealed for a shorter time in order to allow an unsilicided polysilicon layer to remain.

The formation of the gate structures 145 in the second area 315 may use the same type of materials used to form the gate structures 340. However, the gate structures 145 may either be all metal or all doped polysilicon and the dopant concentration will be higher in those instances where the gate structures 145 are comprised of polysilicon. For example, the dopant concentration of the gate structures 145 in area 315 will range from about 1E19 atoms/cm$^3$ to about 1E20 atoms/cm$^3$. At this point, conventional processes are used to complete the fabrication of the semiconductor device 200 as required by use or design. As with previous embodiments, the transistors in the area 310 are configured or designed to operate at the same voltage as the transistors in area 315.

The area covered by the gate structures 340 will comprise a substantial portion of the total area covered by the gate structures in areas 320 and 325. In one aspect, the area covered by gate structures 340 in region 320 will comprise more than 50% of the total area, while in another embodiment, the area covered gate structures 340 will comprise about 80% to 99.9% of the total area.

Figure 4:
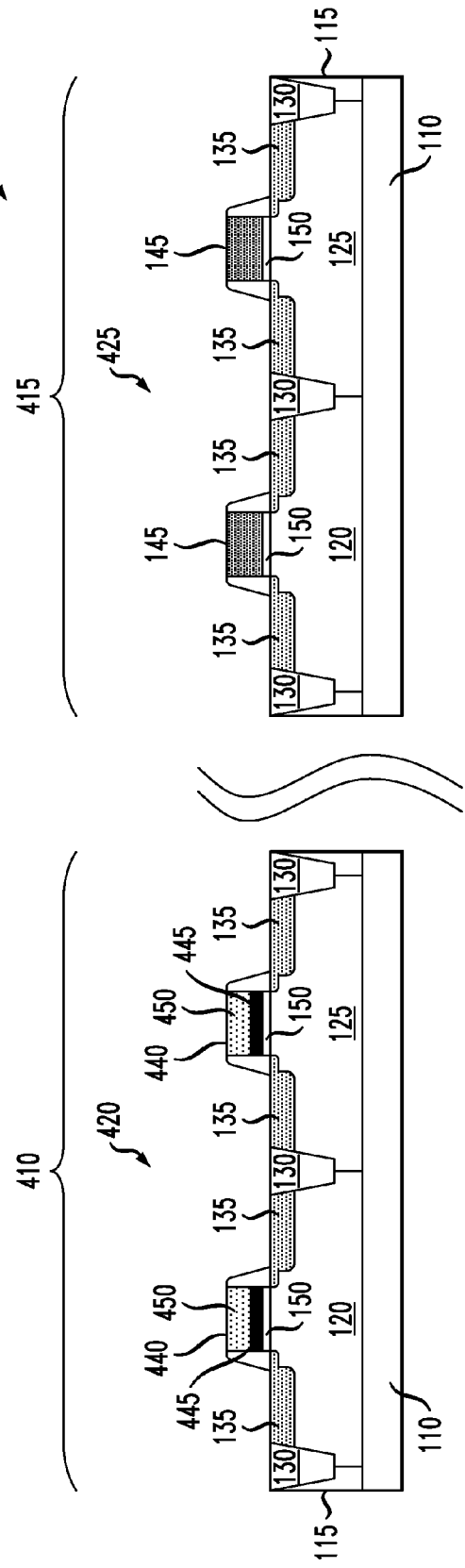
FIG. 4 illustrates a sectional view of another embodiment of a semiconductor device provided by the present invention.

FIG. 4 illustrates another embodiment of a semiconductor device 400 covered by the present invention. This embodiment includes many of the conventional structures discussed above in FIGS. 1, 2 and 3. As such, they are numbered the same and will not be discussed further. One embodiment of the semiconductor device 400 includes two areas 410, 415 comprising transistors 420, 425.

Transistors 420, include gate structures 440 that have been formed in accordance with the present invention to significantly reduce the probability of or prevent hard breakdown. In this particular embodiment, the gate structures 440 have been formed with a stacked structure of polysilicon layers wherein a lower region 445 has a grain size and the upper region 450 has a grain size that is substantially smaller than the grain size of the lower region 445.

The difference in grain sizes may be achieved by altering the deposition temperature of the polysilicon that forms the lower region 445 and the polysilicon that forms the upper region 450. For example, in one embodiment, the lower region 445 may be formed by first depositing an amorphous silicon layer at deposition temperatures that may range from about 520° C. to about 580° C. The amorphous silicon is then converted to a polysilicon by conducting a higher temperature anneal that ranges from about 900° C. to about 1000° C. The resulting polysilicon grain sizes may range from about 80 nm to about 160 nm. The material used to form the polysilicon may be the same as those discussed above regarding other embodiments.

In contrast, the deposition temperature used to form the polysilicon layer that forms the upper region 450 may range from about 600° C. to about 640° C. to produce a polysilicon that has a grain size that ranges from about 20 nm to about 50 nm. The grain sizes are different enough such that that the large-grain-sized polysilicon in the lower region 445 forms a resistor region.

Area 415 is appropriately masked to prevent formation of the larger-grained polysilicon during the deposition of the polysilicon. Those who are skilled in the art will understand how to form the gate structures in the second area 415, while achieving the advantages associated with the present invention.

In addition to altering the grain sizes, the dopant concentration of the gate structures 440 may also be altered in the same way as described above regarding the embodiment of FIG. 2. These processes result in a structure where the transistors in area 410 are configured or designed to operate at the same operating voltage as the transistors in area 415.

The area covered by gate structures 440 will comprise a substantial portion of the total area covered by the gate structures in areas 420 and 425. In one aspect, the area covered by gate structures 440 in area 420 will comprise more than 50% of the total area, while in another embodiment, the area covered by gate structures 440 will comprise about 80% to 99.9% of the total area.

Figure 5:
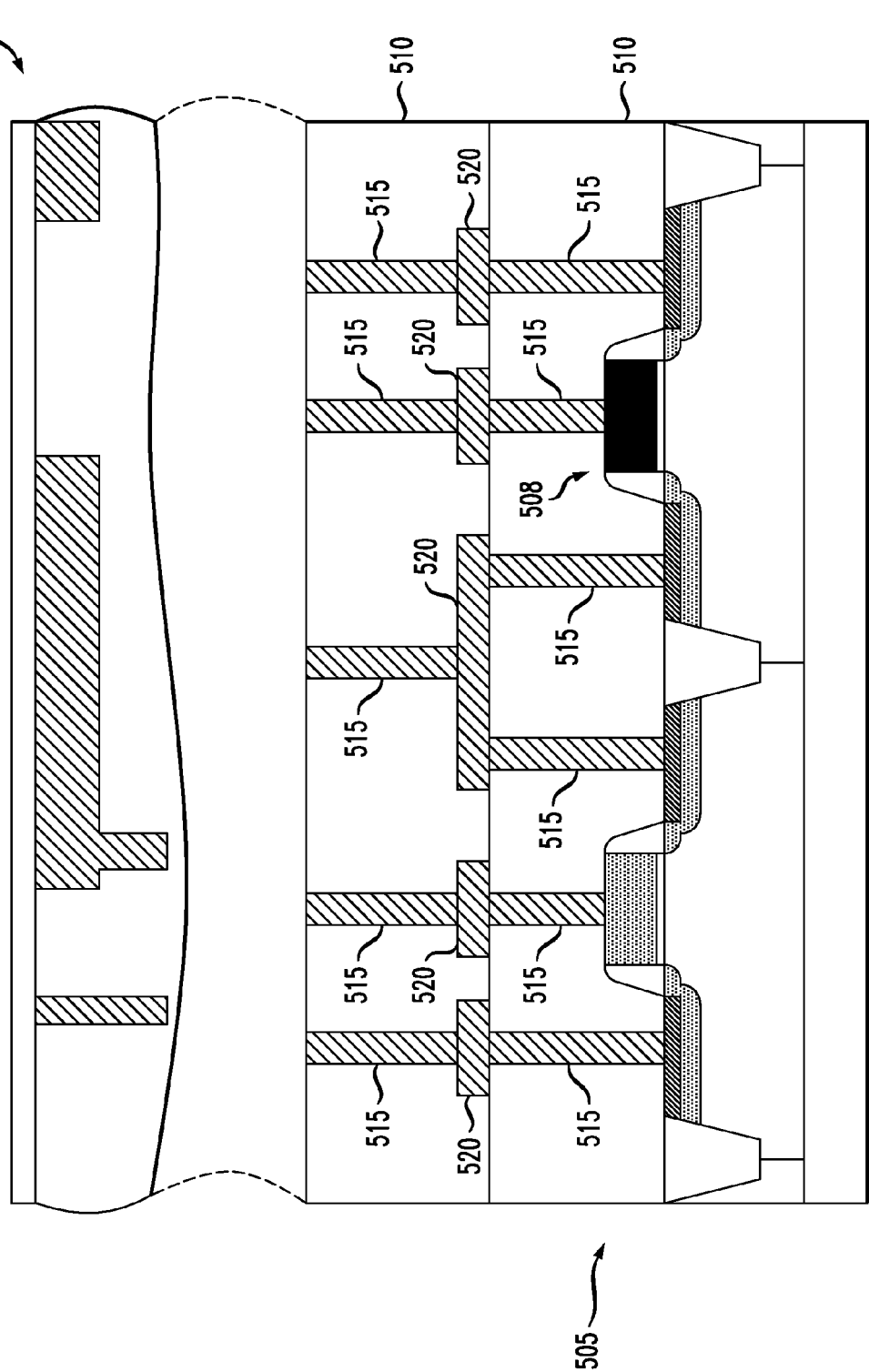
FIG. 5 illustrates a sectional view of an integrated circuit incorporating the semiconductor device provided by the present invention.

FIG. 5 illustrates a sectional view of an IC 500 incorporating the semiconductor device 505, which may be any one of the semiconductor devices of FIGS. 1-4 located in the first area and as provided by the present invention and including conventionally formed transistors 508 located within the second area as discussed above. The IC 500 includes dielectric layers 510 that are conventionally deposited over the semiconductor devices 505. Interconnects 515 and metal lines 520 are formed over and within each of the dielectric layer 510 and electrically connect the semiconductor devices 505 and 508 to form an operative IC.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
   forming a first area of transistors wherein each transistor includes:
      a gate structure, including:
         a gate electrode located over a semiconductor substrate;
         a gate dielectric layer; and
         a resistor region located within the gate and between the gate electrode and the gate dielectric layer, the transistors having a median time to hard breakdown; and
   forming a second area of transistors having a shorter median time to hard breakdown than the transistors in the first area, wherein the transistors in the first area comprise a substantial portion of the total area occupied by the first and second areas and are configured to have a same operating voltage as the transistors in the second area.

2. The method recited in claim 1, wherein the first area comprises from about 80% to about 99.9% of a total area covered by the gate structures in the first and second areas.

3. The method recited in claim 1, wherein forming a resistor region comprises forming a resistor region that has a doping concentration lower than the gate electrode.

4. The method recited in claim 3, wherein the lower dopant concentration ranges from about 1E18 atoms/cm$^{-3}$ to about 5E19 atoms/cm$^{-3}$ and the concentration of the gate electrode ranges from about 1E19 atoms/cm$^{-3}$ to about 1E20 atoms/cm$^{-3}$.

5. The method recited in claim 1, wherein forming the gate electrode comprises forming a region with polysilicon having a given grain size that ranges from about 20 nm to about 50 nm, and forming the resistor region comprises forming a region with a polysilicon having a substantially larger grain size that ranges from about 80 nm to about 160 nm.

6. The method recited in claim 1, wherein the semiconductor device is an integrated circuit and the method further includes depositing interlevel dielectric layers over the gate structures and forming interconnects in the interlevel dielectric layers.

7. The method recited in claim 1, wherein the gate electrode comprises metal or metal silicide and the resistor region comprises a polysilicon having a dopant concentration.

8. The method recited in claim 7, wherein the low dopant concentration ranges from about 1E18 atoms/cm$^{-3}$ to about 1E20 atoms/cm$^{-3}$.

* * * * *